(12) United States Patent
Lan et al.

(10) Patent No.: US 11,658,103 B2
(45) Date of Patent: May 23, 2023

(54) CAPACITOR INTERPOSER LAYER (CIL) CHIPLET DESIGN WITH CONFORMAL DIE EDGE PATTERN AROUND BUMPS

(71) Applicant: QUALCOMM Incorporated, San Diego, CA (US)

(72) Inventors: Je-Hsiung Lan, San Diego, CA (US); Jonghae Kim, San Diego, CA (US); Jinseong Kim, Escondido, CA (US)

(73) Assignee: QUALCOMM Incorporated, San Diego, CA (US)

( * ) Notice: Subject to any disclaimer, the term of this patent is extended or adjusted under 35 U.S.C. 154(b) by 87 days.

(21) Appl. No.: 17/323,249

(22) Filed: May 18, 2021

(65) Prior Publication Data
US 2022/0084922 A1 Mar. 17, 2022

Related U.S. Application Data

(60) Provisional application No. 63/077,533, filed on Sep. 11, 2020.

(51) Int. Cl.
| | |
|---|---|
| *H01L 21/00* | (2006.01) |
| *H01L 23/48* | (2006.01) |
| *H01L 23/498* | (2006.01) |
| *H01L 21/48* | (2006.01) |
| *H01L 23/64* | (2006.01) |

(52) U.S. Cl.
CPC ...... *H01L 23/49816* (2013.01); *H01L 21/486* (2013.01); *H01L 21/4853* (2013.01); *H01L 21/4857* (2013.01); *H01L 23/49822* (2013.01); *H01L 23/49833* (2013.01); *H01L 23/49838* (2013.01); *H01L 23/642* (2013.01)

(58) Field of Classification Search
CPC .......... H01L 23/49816; H01L 21/4853; H01L 23/49822; H01L 23/49833; H01L 23/49838; H01L 23/642
See application file for complete search history.

(56) References Cited

U.S. PATENT DOCUMENTS

| | | | |
|---|---|---|---|
| 5,119,171 A | 6/1992 | Lesk et al. | |
| 7,795,704 B2* | 9/2010 | Wu | H01L 23/585 |
| | | | 257/E29.012 |
| 9,548,274 B1* | 1/2017 | Yu | H01L 23/5384 |
| 10,700,012 B2* | 6/2020 | Fanelli | H01L 21/78 |

(Continued)

OTHER PUBLICATIONS

International Search Report and Written Opinion—PCT/US2021/039886—ISA/EPO—dated Feb. 4, 2022.

(Continued)

*Primary Examiner* — Nicholas J Tobergte
(74) *Attorney, Agent, or Firm* — Qualcomm Incorporated

(57) ABSTRACT

An integrated circuit (IC) package includes a chip. The chip has a front-side surface and a backside surface, opposite the front-side surface. The front-side surface of the chip includes a plurality of bump sites. The integrated circuit package also includes a plurality of dies. Each of the plurality of dies are composed of integrated passive devices. The plurality of dies have conformal die edge patterns to enable placement of a front-side surface of each of the plurality of dies on predetermined portions of the plurality of bumps sites on the front-side surface of the chip.

20 Claims, 12 Drawing Sheets

(56) References Cited

U.S. PATENT DOCUMENTS

| | | | | |
|---|---|---|---|---|
| 2002/0050655 A1* | 5/2002 | Travis | ............... | H01L 21/31053 |
| | | | | 438/626 |
| 2008/0277659 A1* | 11/2008 | Hsu | .................... | H01L 27/0203 |
| | | | | 257/E23.179 |
| 2012/0139102 A1* | 6/2012 | Rahman | .............. | H01L 25/0655 |
| | | | | 257/737 |
| 2016/0134974 A1* | 5/2016 | Salmon | ................. | B81C 1/0023 |
| | | | | 381/174 |
| 2016/0260865 A1* | 9/2016 | Peddada | ............. | H01L 33/0095 |
| 2016/0268472 A1* | 9/2016 | Peddada | ................ | H01L 23/544 |
| 2016/0300800 A1* | 10/2016 | Zeng | ....................... | H01L 22/34 |
| 2018/0350615 A1* | 12/2018 | Ansell | ............... | H01L 21/30655 |
| 2019/0131273 A1* | 5/2019 | Chen | .................. | H01L 25/0652 |

OTHER PUBLICATIONS

Partial International Search Report—PCT/US2021/039886—ISA/EPO—dated Oct. 14, 2021.

* cited by examiner

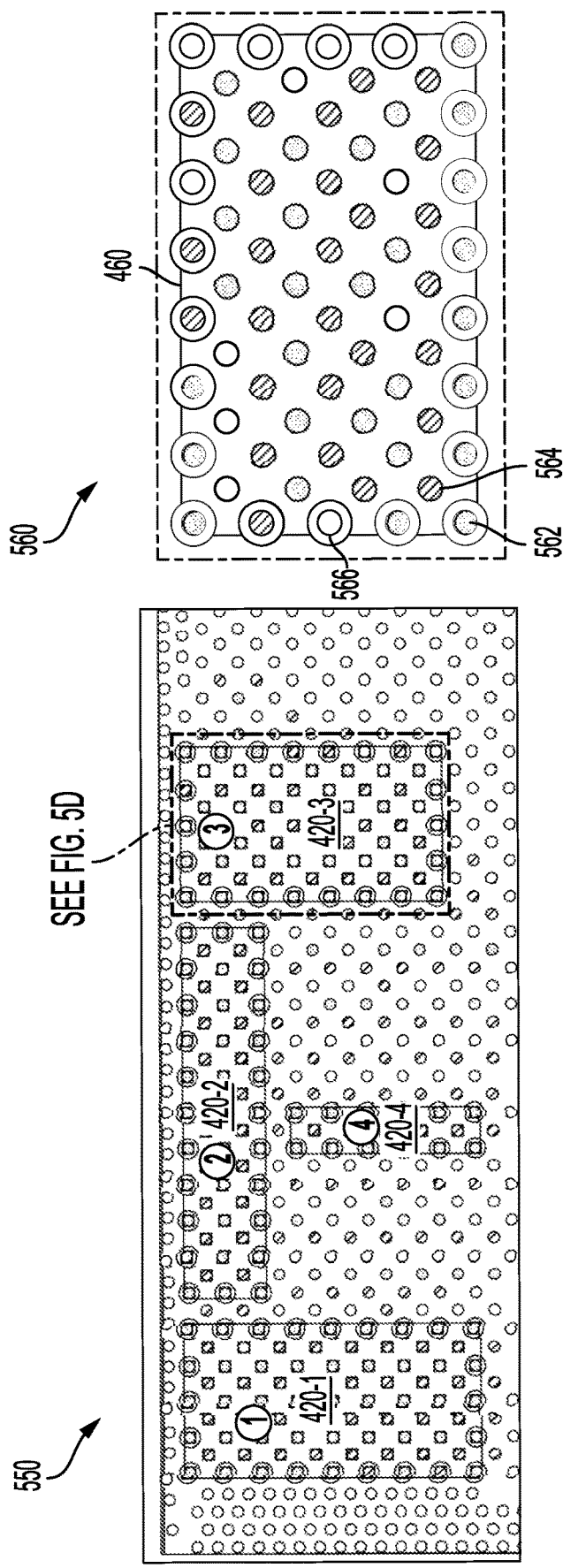

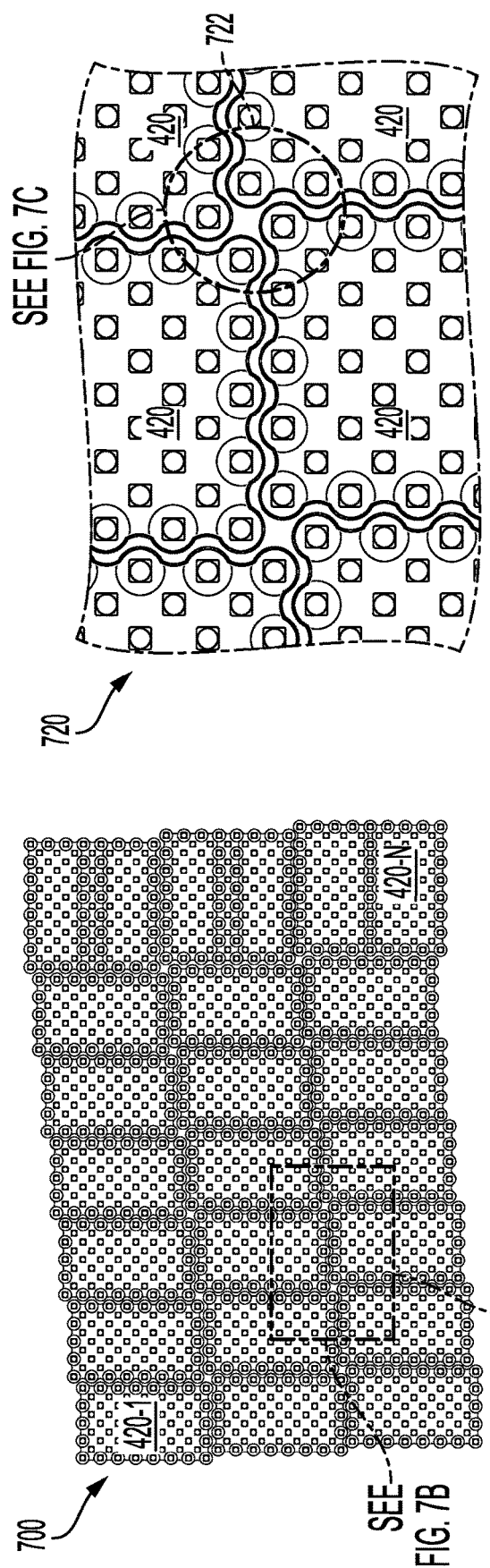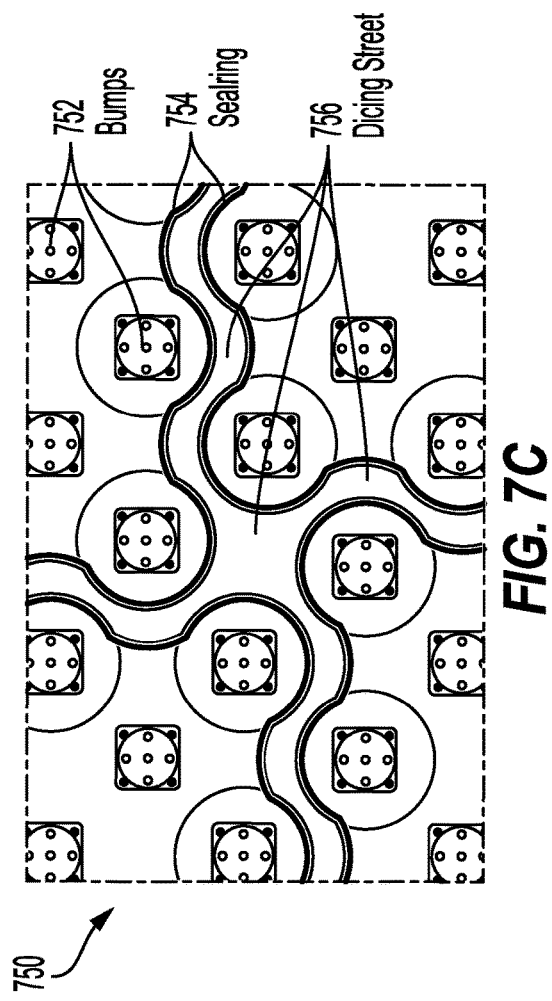

CAPACITOR INTERPOSER LAYER (CIL) CHIPLET DESIGN WITH CONFORMAL DIE EDGE PATTERN AROUND BUMPS

CROSS-REFERENCE TO RELATED APPLICATION

The present application claims the benefit of U.S. Provisional Patent Application No. 63/077,533, filed Sep. 11, 2020, and titled "CAPACITOR INTERPOSER LAYER (CIL) CHIPLET DESIGN WITH CONFORMAL DIE EDGE PATTERN AROUND BUMPS," the disclosure of which is expressly incorporated by reference herein in its entirety.

BACKGROUND

Field

Aspects of the present disclosure relate to integrated circuits and, more particularly, to a capacitor interposer layer (CIL) chiplet design with a conformal die edge pattern around bumps formed by plasma dicing.

Background

Electrical connections exist at each level of a system hierarchy. This system hierarchy includes interconnection of active devices at a lowest system level all the way up to system level interconnections at the highest level. For example, interconnect layers can connect different devices together on an integrated circuit. As integrated circuits become more complex, more interconnect layers are used to provide the electrical connections between the devices. More recently, the number of interconnect levels for circuitry has substantially increased due to the large number of devices that are now interconnected in a modern electronic device. The increased number of interconnect levels for supporting the increased number of devices involves more intricate processes.

State-of-the-art mobile application devices demand a small form factor, low cost, a tight power budget, and high electrical performance. Mobile package design has evolved to meet these divergent goals for enabling mobile applications that support multimedia enhancements. These mobile applications, however, are susceptible to power and signal routing issues when multiple dies are arranged within the small form factor.

SUMMARY

An integrated circuit (IC) package includes a chip. The chip has a front-side surface and a backside surface, opposite the front-side surface. The front-side surface of the chip includes a plurality of bump sites. The integrated circuit package also includes a plurality of dies. Each of the plurality of dies are composed of integrated passive devices. The plurality of dies have conformal die edge patterns to enable placement of a front-side surface of each of the plurality of dies on predetermined portions of the plurality of bumps sites on the front-side surface of the chip.

A method for fabricating a chip includes fabricating a plurality of dies. Each of the plurality of dies are composed of integrated passive devices. The method also includes plasma etching the plurality of dies according to the conformal chiplet edge patterns of the plurality of dies. The method further includes placing and attaching the plurality of dies on predetermined portions of a plurality of bump sites on a front-side surface of a chip.

This has outlined, rather broadly, the features and technical advantages of the present disclosure in order that the detailed description that follows may be better understood. Additional features and advantages of the present disclosure will be described below. It should be appreciated by those skilled in the art that this present disclosure may be readily utilized as a basis for modifying or designing other structures for carrying out the same purposes of the present disclosure. It should also be realized by those skilled in the art that such equivalent constructions do not depart from the teachings of the present disclosure as set forth in the appended claims. The novel features, which are believed to be characteristic of the present disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

FIGS. 5A-5D are overhead views of a layout of bump sites on the front-side of the chip of FIG. 4, including capacitor interposer layer (CIL) chiplets placed and attached to predetermined portions of the bump sites, according to aspects of the present disclosure.

FIGS. 7A-7C are top views illustrating fabrication of capacitor interposer layer (CIL) chiplets using a plasma dicing method, according to aspects of the present disclosure.

DETAILED DESCRIPTION

Figure 1:
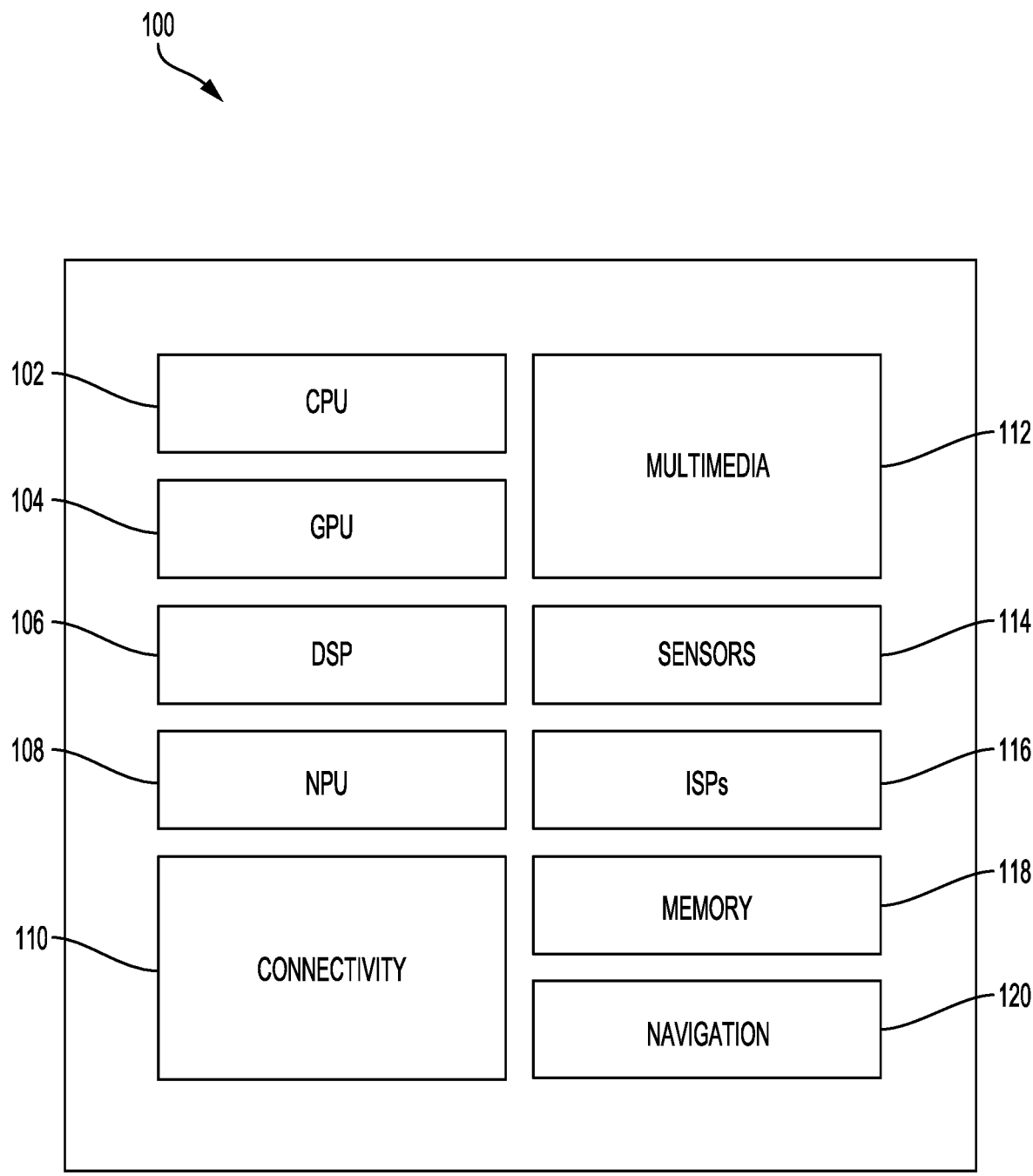
FIG. 1 illustrates an example implementation of a system-on-a-chip (SOC), including a capacitor interposer layer (CIL) chiplet architecture having a conformal chiplet edge pattern, in accordance with certain aspects of the present disclosure.

The detailed description set forth below, in connection with the appended drawings, is intended as a description of various configurations and is not intended to represent the only configurations in which the concepts described may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described, the use of the term "and/or" is intended to represent an "inclusive OR," and the use of the term "or" is intended to represent an "exclusive OR." As described, the term "exemplary" used throughout this description means "serving as an example, instance, or illustration," and should not necessarily be construed as preferred or advantageous over other exemplary configurations. As described, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described, the term "proximate" used throughout this description means "adjacent, very near, next to, or close to." As described, the term "on" used throughout this description means "directly on" in some configurations, and "indirectly on" in other configurations.

A system hierarchy includes interconnection of active devices at a lowest system level all the way up to system level interconnections at a highest level. Electrical connections exist at each of the levels of the system hierarchy to connect different devices together on an integrated circuit. As integrated circuits become more complex, however, more interconnect layers are used to provide the electrical connections between the devices. More recently, the number of interconnect levels for circuitry has substantially increased due to the large number of devices that are now interconnected in a modern electronic device.

These interconnections include back-end-of-line (BEOL) interconnect layers, which may refer to the conductive interconnect layers for electrically coupling to front-end-of-line (FEOL) active devices of an integrated circuit. The various BEOL interconnect layers are formed at corresponding BEOL interconnect levels. Lower BEOL interconnect levels use thinner metal layers relative to upper BEOL interconnect levels. The BEOL interconnect layers may electrically couple to middle-of-line (MOL) interconnect layers, which interconnect to the FEOL active devices of an integrated circuit.

State-of-the-art mobile application devices demand a small form factor, low cost, a tight power budget, and high electrical performance. Mobile package design has evolved to meet these divergent goals for enabling mobile applications that support multimedia enhancements. For example, fan-out (FO) wafer level packaging (WLP) or FO-WLP process technology is a new development in packaging technology that is useful for mobile applications. This chip first FO-WLP process technology solution provides flexibility to fan-in and fan-out connections from a die to package balls. In addition, this solution also provides a height reduction of a first level interconnect between the die and the package balls of mobile application devices. These mobile applications, however, are susceptible to power and signal routing issues when multiple dies are arranged within the small form factor.

As described, the term "chiplet" may refer to an integrated circuit block, a functional circuit block, or other like circuit block specifically designed to work with other similar chiplets to form a larger, more complex chiplet architecture. Chiplet architectures are becoming mainstream as significant power performance area (PPA) yield enhancements are demonstrated for chiplet architecture product lines. Unfortunately, successful chiplet architectures involve high power density targets, which impose significant power delivery losses. For example, power delivery network (PDN) performance in chiplet architectures is significantly affected by supply voltage (Vdd) droop due to parasitic inductance through the tracing from a battery to an application processor (AP) chip or a system on chip (SOC). The problem is exacerbated by shrinking of ball pitch, increasing of die size, and/or thinning of substrates to accommodate the small form factor.

Various aspects of the present disclosure provide an integrated circuit (IC) package having a capacitor interposer layer (CIL) chiplet architecture. The process flow for fabrication of the CIL chiplet architecture may include silicon-integrated passive device (SIPD) process technology. It will be understood that the term "layer" includes film, and is not construed as indicating a vertical or horizontal thickness unless otherwise stated. As described, the term "substrate" may refer to a substrate of a diced wafer or may refer to a substrate of a wafer that is not diced. As further described, the term "laminate" may refer to a multilayer sheet to enable packaging of an IC device. As described, the term "chiplet" may refer to an integrated circuit block, a functional circuit block, or other like circuit block specifically designed to work with other similar chiplets to form larger more complex chips. The terms "substrate," "wafer," and "laminate" may be used interchangeably. Similarly, the terms "chip," "chiplet," and "die" may be used interchangeably.

Aspects of the present disclosure are directed to an integrated circuit (IC) package including a capacitor interposer layer (CIL) chiplet architecture integrated with a chip. According to these aspects of the present disclosure, the IC package includes a chip having a front-side surface and a backside surface, opposite the front-side surface. In this configuration, the front-side surface of the chip includes bump sites, such as supply voltage (Vdd) bumps and ground voltage (Vss) bumps. In one configuration, the CIL chiplets (e.g., die) are placed on and attached to the chip bump sites. In this configuration, the CIL chiplets have conformal die edge patterns to enable placement for improved coverage of the chip bump sites. In this example, a front-side surface of the CIL chiplets are placed and attached to predetermined portions of the chip bump sites on the front-side surface of the chip.

FIG. 1 illustrates an example implementation of a host system-on-a-chip (SOC) 100, which includes a capacitor interposer layer (CIL) chiplet architecture having a conformal chiplet edge pattern, in accordance with aspects of the present disclosure. The host SOC 100 includes processing blocks tailored to specific functions, such as a connectivity block 110. The connectivity block 110 may include fifth generation (5G) connectivity, fourth generation long term evolution (4G LTE) connectivity, Wi-Fi connectivity, USB connectivity, Bluetooth® connectivity, Secure Digital (SD) connectivity, and the like.

In this configuration, the host SOC 100 includes various processing units that support multi-threaded operation. For the configuration shown in FIG. 1, the host SOC 100 includes a multi-core central processing unit (CPU) 102, a graphics processor unit (GPU) 104, a digital signal processor (DSP) 106, and a neural processor unit (NPU) 108. The host SOC 100 may also include a sensor processor 114, image signal processors (ISPs) 116, a navigation module 120, which may include a global positioning system, and a memory 118. The multi-core CPU 102, the GPU 104, the DSP 106, the NPU 108, and the multi-media engine 112 support various functions such as video, audio, graphics, gaming, artificial networks, and the like. Each processor core of the multi-core CPU 102 may be a reduced instruction set computing (RISC) machine, an advanced RISC machine (ARM), a microprocessor, or some other type of processor. The NPU 108 may be based on an ARM instruction set.

Figure 2:
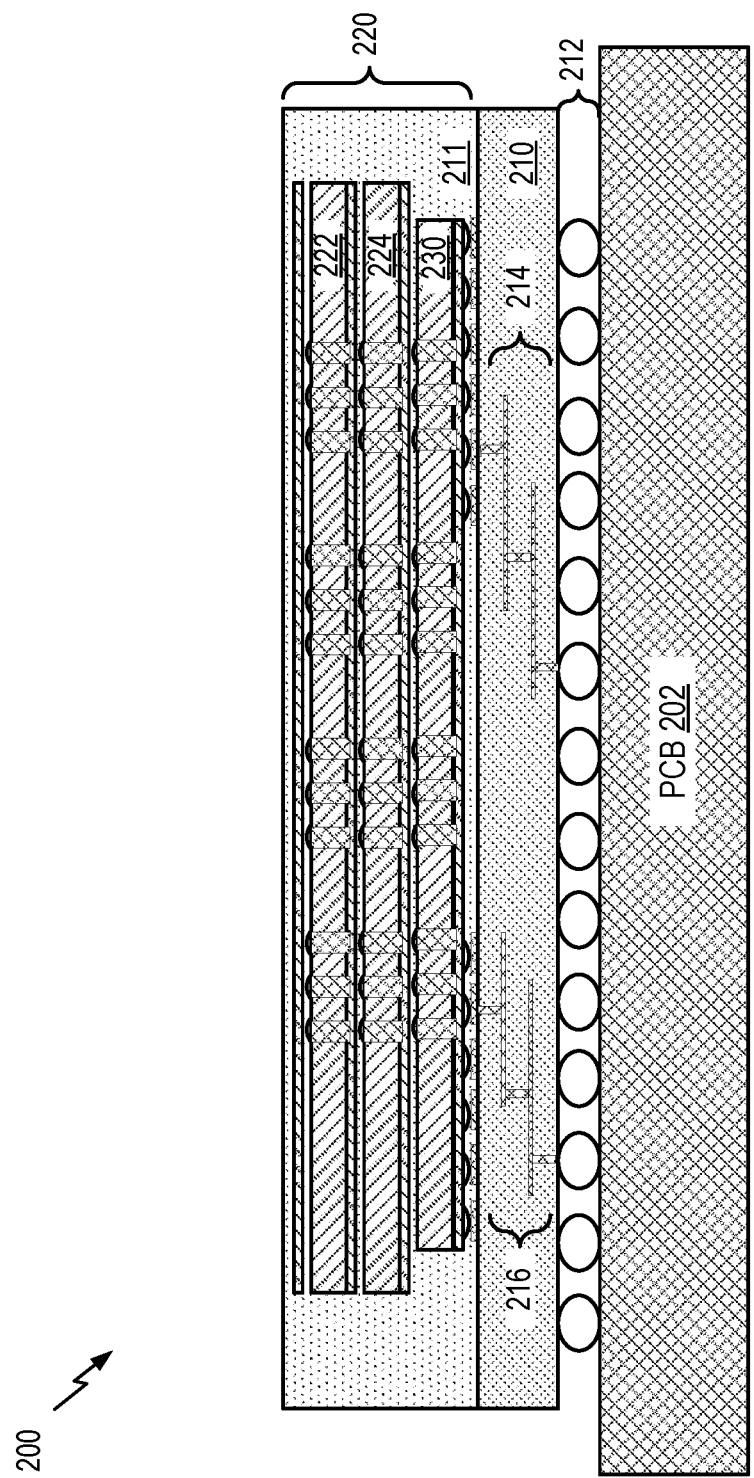
FIG. 2 shows a cross-sectional view of a stacked integrated circuit (IC) package, including the system-on-a-chip (SOC) of FIG. 1.

FIG. 2 shows a cross-sectional view illustrating a stacked integrated circuit (IC) package 200 of the SOC 100 of FIG. 1. Representatively, the stacked IC package 200 includes a printed circuit board (PCB) 202 connected to a package substrate 210 with interconnects 212. In this configuration, the package substrate 210 includes conductive layers 214 and 216. Above the package substrate 210 is a three-dimensional (3D) chip stack 220, including stacked dies 222, 224, and 230, encapsulated by mold compound 211. In one aspect of the present disclosure, the die 230 is the SOC of FIG. 1.

Figure 3:
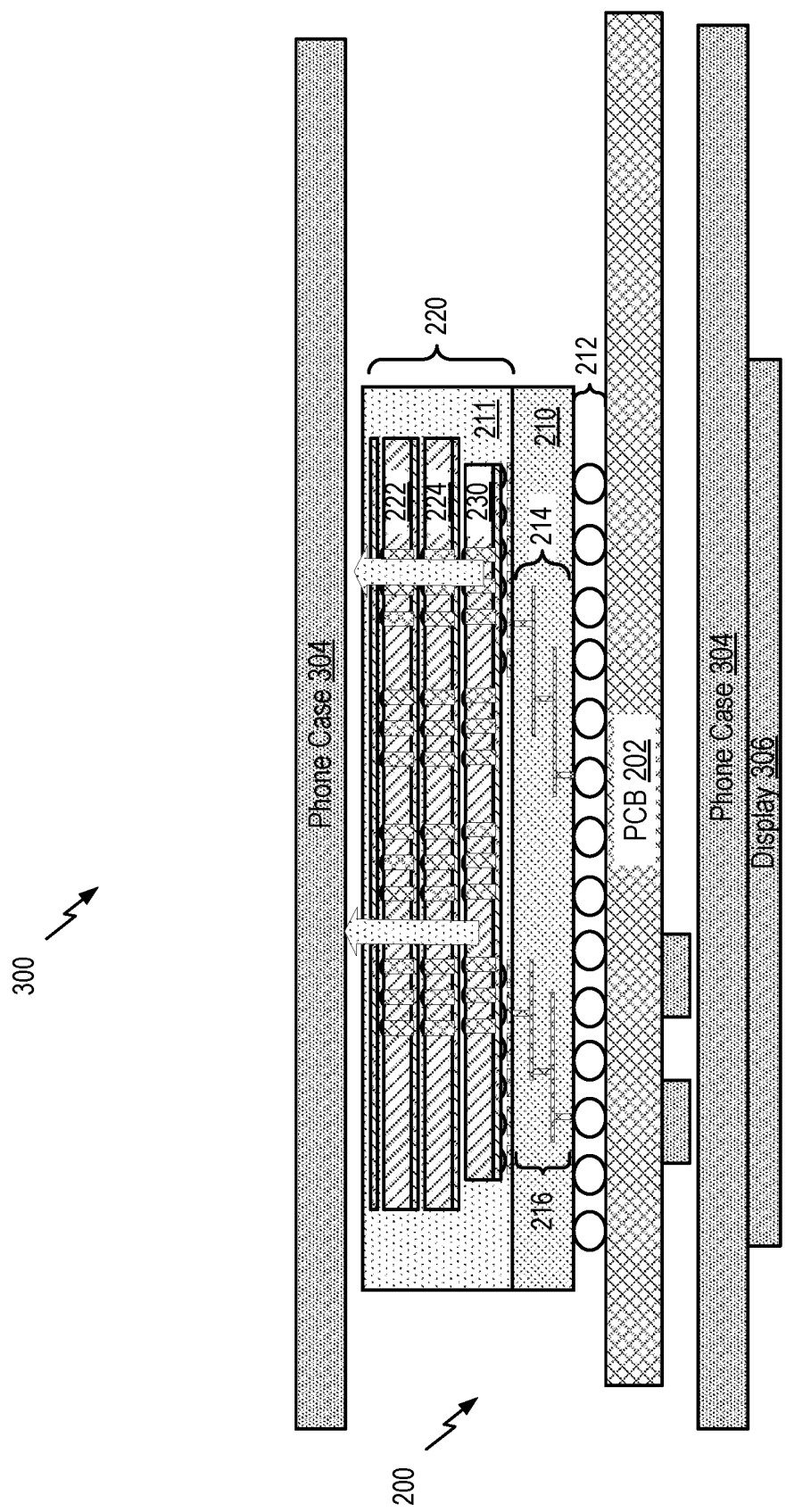
FIG. 3 shows a cross-sectional view illustrating the stacked integrated circuit (IC) package of FIG. 2, incorporated into a wireless device, according to one aspect of the present disclosure.

FIG. 3 shows a cross-sectional view illustrating the stacked IC package 200 of FIG. 2, incorporated into a wireless device 300, according to one aspect of the present disclosure. As described, the wireless device 300 may include, but is not limited to, a smartphone, tablet, handheld device, or other limited form factor device configured for fifth generation (5G) communications. Representatively, the stacked IC package 200 is arranged within a phone case 304, including a display 306. In this configuration, capacitor interposer layer (CIL) chiplets having a conformal chiplet edge pattern are integrated into the stacked IC package 200, for example, as shown in FIG. 4.

Figure 4:
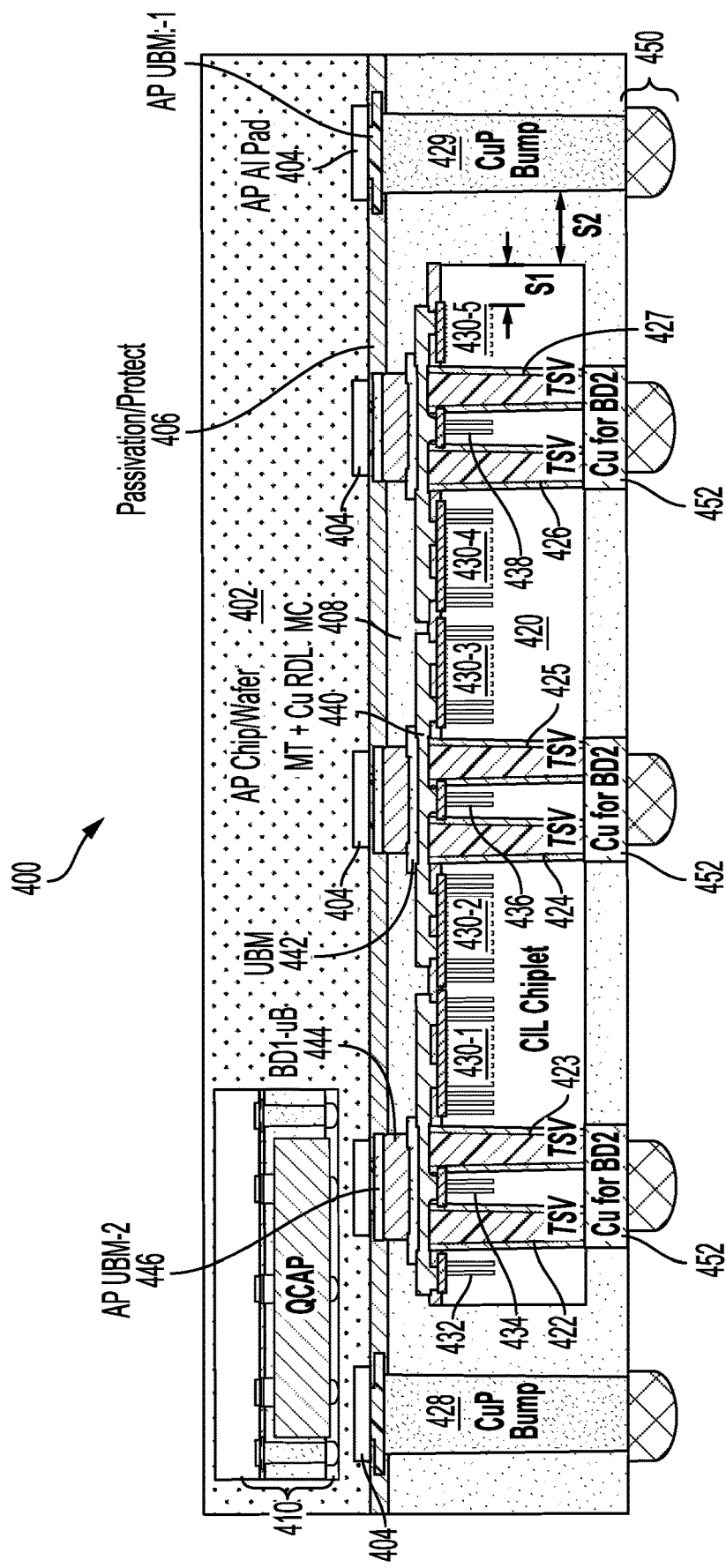
FIG. 4 is a cross-sectional diagram of an integrated circuit (IC) package, having a chip integrated with a capacitor interposer layer (CIL) chiplet, according to aspects of the present disclosure.

FIG. 4 is a cross-sectional diagram of an integrated circuit (IC) package 400, having a chip 402 integrated with a capacitor interposer layer (CIL) chiplet 420, according to aspects of the present disclosure. In one configuration, the package 400 includes the chip 402 having contact pads 404 and coupled to the CIL chiplet 420 through a passivation layer 406 and a mold compound 408, which encapsulates the CIL chiplet 420. In this configuration, the chip 402 includes a passive device 410 (e.g., a surface mount capacitor) and may be configured as an application processor (AP) chip or a system on chip (SOC), an AP chipset, a mobile station modem (MSM) chipset, a radio frequency (RF) integrated circuit (RFIC) chipset, a radio frequency (RF) integrated circuit (RFIC) chip, or other like high performance chipset.

According to aspects of the present disclosure, the capacitor interposer layer (CIL) chiplet 420 (e.g., an interposer chiplet) is integrated with the chip 402 for improving performance of a power distribution network (PDN) of the integrated circuit (IC) package 400 using silicon-integrated passive devices (SIPDs). In this example, the CIL chiplet 420 is configured with deep trench capacitors (DTCs) 430 (430-1 . . . 430-5) and through substrate vias (TSVs) within a die substrate (or chiplet substrate) of the CIL chiplet 420. The TSVs may include a first via pair 422 and 423, a second via pair 424 and 425, and a third via pair 426 and 427, coupled to a redistribution layer 440. In addition, capacitors (e.g., 432, 434, 436, 438) are also coupled to BEOL metal layers and the redistribution layer 440. In this configuration, the redistribution layer 440 is coupled to the contact pads 404 of the chip 402 through first under bump metallizations 442, micro bumps 444, and second under bump metallizations 446. In addition, package bumps 450 are coupled to the CIL chiplet 420 through contact pads 452 and conductive pillars 428 and 429.

In this example, a power distribution network (PDN) performance of the chip 402 (e.g., an application processor (AP) chipset) is improved by reducing a supply voltage (Vdd) droop by using silicon integrated passive devices (e.g., high-density (HD) metal-insulator-metal (HD-MIM) capacitors and/or the deep trench capacitors (DTC) 430 (430-1 . . . 430-5)) of the capacitor interposer layer (CIL) chiplet 420 to control a parasitic inductance associated with traces from a battery to the chip 402. In current power distribution network designs, contact pads 404 of the chip 402 (and substrate) are fixed. As a result, bump sites (e.g., the contact pads 404) on the chip 402 are not adjustable.

Figure 5A:
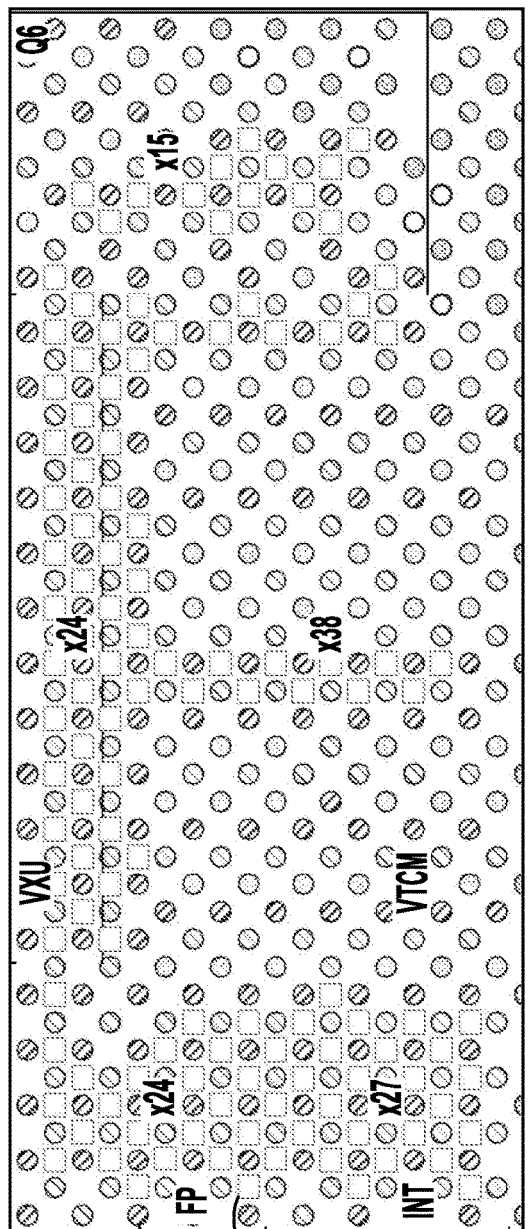

FIGS. 5A to 5D are overhead views of a layout 500 of bump sites 504 on a front-side of the chip 402 of FIG. 4, including capacitor interposer layer (CIL) chiplets 420 placed and attached to predetermined portions of the bump sites 504, according to aspects of the present disclosure. FIG. 5A illustrates an overhead view of the layout 500 of the bump sites 504 on the front-side of the chip 402 of FIG. 4. In this example, supply voltage (Vdd) and ground voltage (Vss) bumps 510 are designed in a stripe pattern. As shown in FIG. 5A, certain portions (e.g., Vdd and Vss bumps 510) of the bump sites 504 may be more important than others of the bump sites 504. In this example, the Vdd and Vss bumps 510 of the chip 402 are designed and populated in a pattern that may not coincide with a die-to-wafer (D2W) placement and attachment process of the CIL chiplets 420. This lack of coincidence may prevent substantial coverage of the Vdd and Vss bumps 510 using the CIL chiplets 420 for interconnecting with the passive devices (e.g., deep trench capacitors (DTCs) 430 (430-1 . . . 430-5) of the CIL chiplets 420.

For example, due to the limited spacing between the bump sites 504, a coverage of the bump sites 504 with capacitor interposer layer (CIL) chiplets 420 may be performed by rotating (e.g., by 45 degrees) the CIL chiplets 420 during the die-to-wafer (D2W) placement and attachment process. That is, D2W placement and attachment processing places and attaches the CIL chiplets 420 to the front-side of the bump sites 504 using a predetermined degree (e.g., 45 degrees) of rotation to comply with package/assembly rules. Unfortunately, this CIL chiplet design and the package/assembly process is not straightforward and may become unduly complicated. Furthermore, the rotation of the CIL chiplets 420 may fail to provide sufficient coverage of the supply voltage (Vdd) and ground voltage (Vss) bumps 510. This low coverage of the critical bumps (e.g., Vdd and Vss bumps 510) detrimentally affects the power distribution network performance of the integrated circuit (IC) package 400.

Figure 5B:
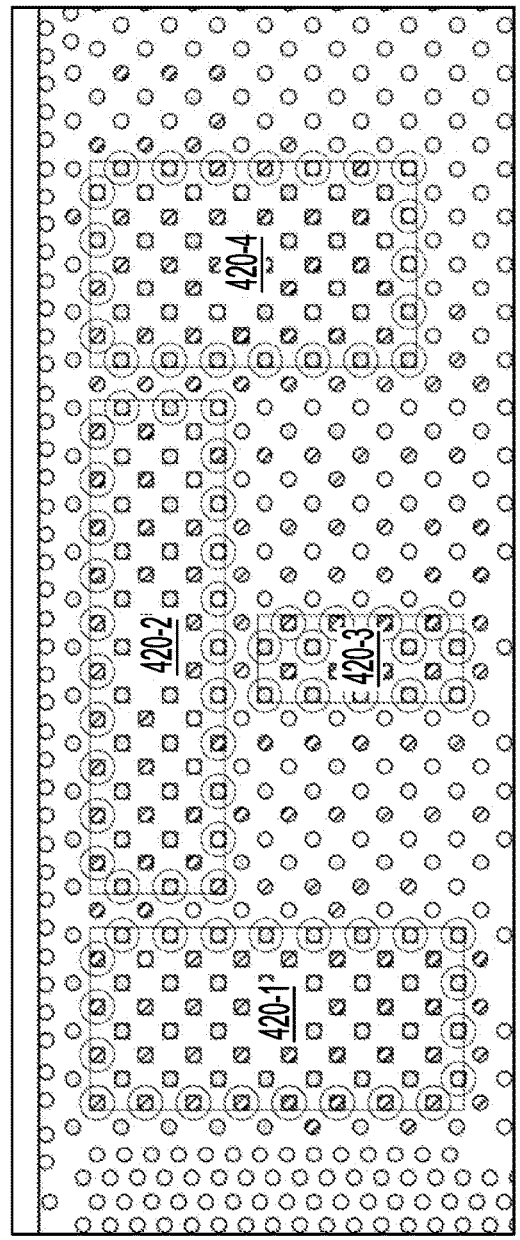

FIG. 5B illustrates an overhead view of a layout 550 of the bump sites 504 on the front-side of the chip 402 of FIG. 4, including an array of capacitor interposer layer (CIL) chiplets 420 (shown as 420-1 . . . 420-4) placed and attached to predetermined portions of the bump sites 504, according to aspects of the present disclosure. Attachment of the CIL chiplets 420 may be performed through the through substrate vias (TSVs) (e.g., the first via pair 422 and 423, the second via pair 424 and 425, and/or the third via pair 426 and 427) inside the CIL chiplets 420, while maintaining sufficient spacing from adjacent ones of the bump sites 504 to conform with the package/assembly rules. This improvement is provided by a CIL chiplet 420 to chip die-to-wafer (D2W) placement and attachment process for three-dimensional (3D) integrated circuit (3DIC) integration of the IC package 400, as shown in FIG. 4.

FIGS. 5C and 5D are top views illustrating the layout 550 of FIG. 5B and an exploded view 560 of one of the capacitor interposer layer (CIL) chiplets 420, according to aspects of the present disclosure. A third CIL chiplet 420-3 is shown including supply voltage (Vdd) bumps 562, ground voltage (Vss) bumps 564, and other bumps 566. In this configuration, the third CIL chiplet 420-3 is shown with a curved die edge 460 fully conformal to adjacent bumps for meeting the CIL chiplet process design but also the CIL chiplet-application processor (AP) package assembly rules. In one aspect of the present disclosure, the curved die edge 460 is formed according to a plasma dicing/singulation method, that allows the die-to-wafer (D2W) placement and attachment process of the third CIL chiplet 420-3 underneath the chip 402 (e.g., AP wafer/chipset).

In FIGS. 5C and 5D, the CIL chiplets 420 (e.g., 420-1 . . . 420-4)) are shown with conformal die edge patterns. For example, the third chiplet 420-3 is shown with a curved die edge 460 fully conformal to adjacent bumps for meeting the CIL chiplet process design but also the CIL chiplet-application processor (AP) package assembly rules. In aspects of the present disclosure, the conformal die edge patterns of the CIL chiplets 420 may be composed of rounded die edges. In another aspect of the present disclosure, the conformal die edge patterns of the CIL chiplets 420 are composed of curved die edges. In one configuration, the curved die edges correspond to bumps sites proximate the curved die edges when the CIL chiplets are attached.

Beneficially, the proposed capacitor interposer layer (CIL) chiplet design and plasma dicing method meet: (i) a spacing rule (S2) between the CIL chiplet 420 and conductive pillars of the chip 402 of FIG. 4, and (ii) spacing (S1) between a keep out zone (KoZ) of the deep trench capacitors 430 (430-1 . . . 430-5) of FIG. 4 and a CIL chiplet edge or seal ring inner boundary (see FIG. 7C). In this configuration, the CIL chiplets 420 of FIG. 4 provide almost complete coverage of the supply voltage (Vdd) and ground voltage (Vss) bumps 510 of the chip 402 using the smallest chiplet number and die size. Although four of the CIL chiplets 420 (e.g., 420-1 . . . 420-4) are shown, it should be recognized that any number of the CIL chiplets 420 may be used depending on the desired application, such as an application processor (AP) die package.

Figure 6:
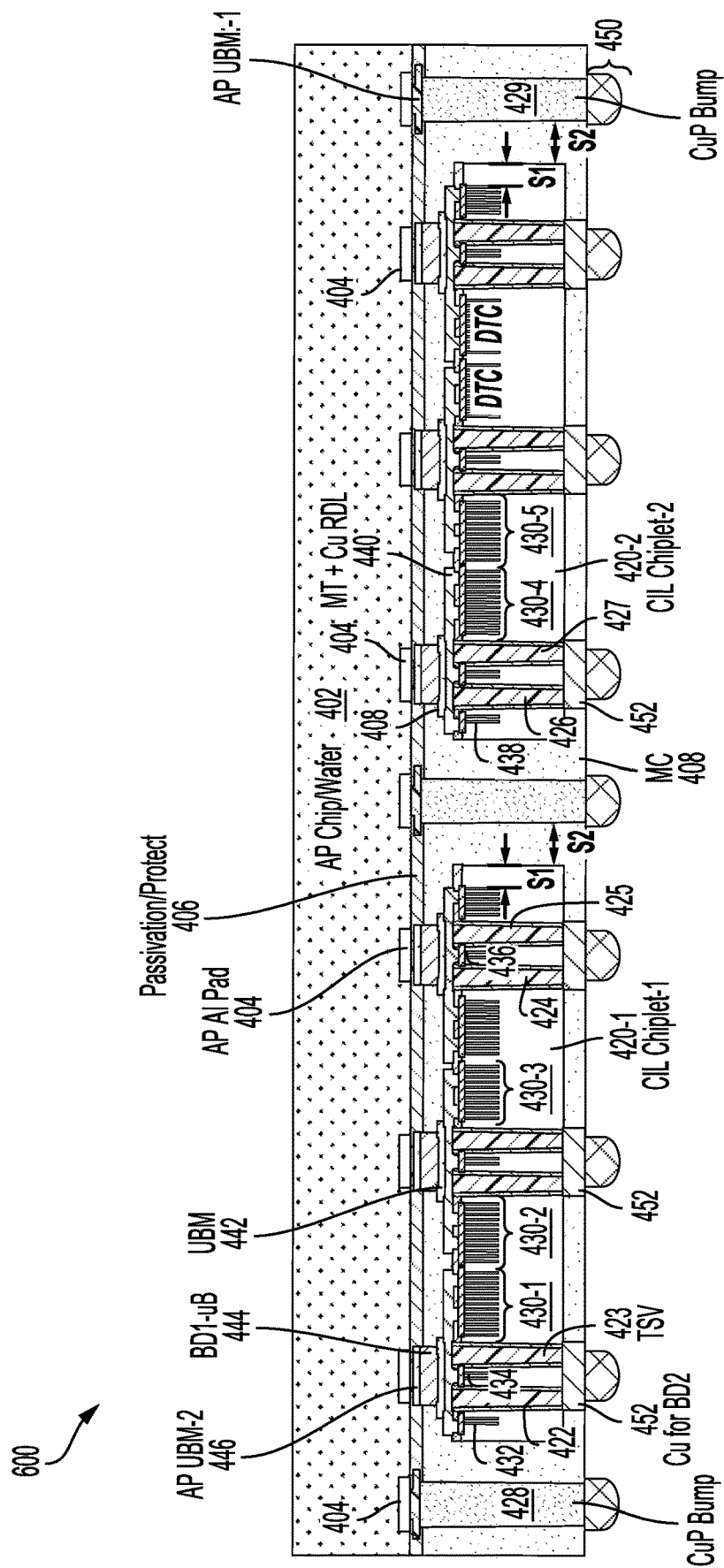
FIG. 6 is a cross-sectional diagram of an integrated circuit (IC) package, having a chip integrated with a first capacitor interposer layer (CIL) chiplet and a second CIL chiplet, according to aspects of the present disclosure.

FIG. 6 is a cross-sectional diagram of an integrated circuit (IC) package 600, having a chip 402 integrated with a first capacitor interposer layer (CIL) chiplet 420-1 and a second CIL chiplet 420-2, according to aspects of the present disclosure. This configuration of the IC package 600 is similar to the configuration of the IC package 400 shown in FIG. 4 and, therefore, uses similar reference numbers, which are not further described. In this configuration, the chip 402 may be configured as an application processor (AP) chip, an AP chipset, a mobile station modem (MSM) chipset, a radio frequency (RF) integrated circuit (RFIC) chipset, or other like high performance chipset. Although two of the CIL chiplets 420 (e.g., 420-1 and 420-2) are shown, it should be recognized that any number of the CIL chiplets 420 may be used depending on the desired application, for example, as shown in FIGS. 7A to 7C.

FIGS. 7A-7C are top (or layout) views illustrating fabrication of capacitor interposer layer (CIL) chiplets using a plasma dicing method and precise singulation, according to aspects of the present disclosure. FIG. 7A illustrates a top view of a layout 700 of the CIL chiplets 420 (420-1 . . . 420-N) of FIG. 4. In this example, the curved edge of the CIL chiplets 420 enables adjoining of the CIL chiplets 420 (420-1 . . . 420-N) to account for adjacent bumps when attached to chip bump sites, as shown FIGS. 5A-5D.

FIG. 7B illustrates an exploded view 720 of a highlighted area 702 (shown in FIG. 7A) of the capacitor interposer layer (CIL) chiplets 420. FIG. 7C illustrates an exploded view 750 of a highlighted area 722 (shown in FIG. 7B) of the CIL chiplets 420. In this example, bumps 752 and a seal ring 754 of the CIL chiplets 420 as well as a dicing street 756 are shown. The dicing street 756 enables plasma dicing and precise singulation of the CIL chiplets 420. In this aspect of the present disclosure, plasma dicing includes a combination of dry etching and deep reactive-ion etching (DRIE). For dry etching, a silicon layer being etched is removed by chemical and physical (e.g., ion bombardment) processes. In this example, reacted products are removed during a gas phase. For deep reactive-ion etching, a repeated etching process is combined with a passivation (e.g., $C_4F_8$) process to precisely singulate the CIL chiplets 420.

Figure 8A:
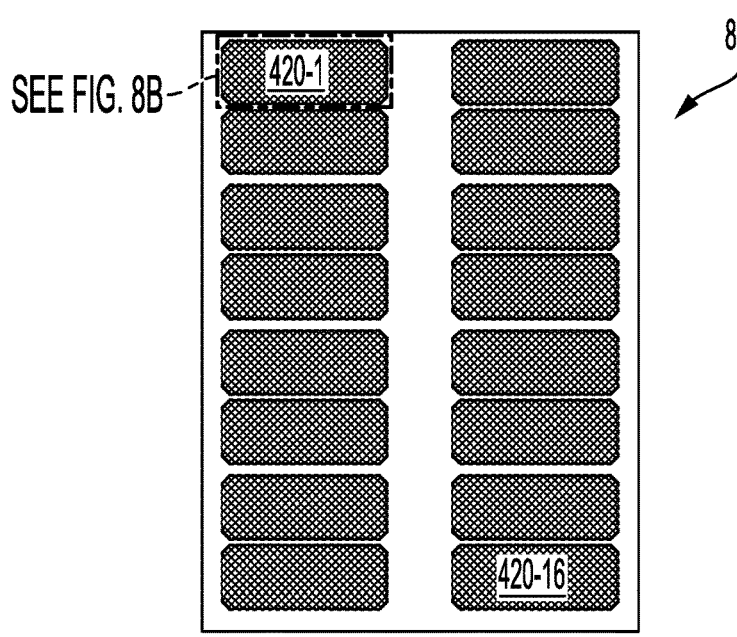
FIGS. 8A-8C are top views illustrating fabrication of capacitor interposer layer (CIL) chiplets using a die-to-wafer (D2W) stacking placement on an application processor (AP) chip or a system on chip (SOC), according aspects of the present disclosure.
Figure 8B:
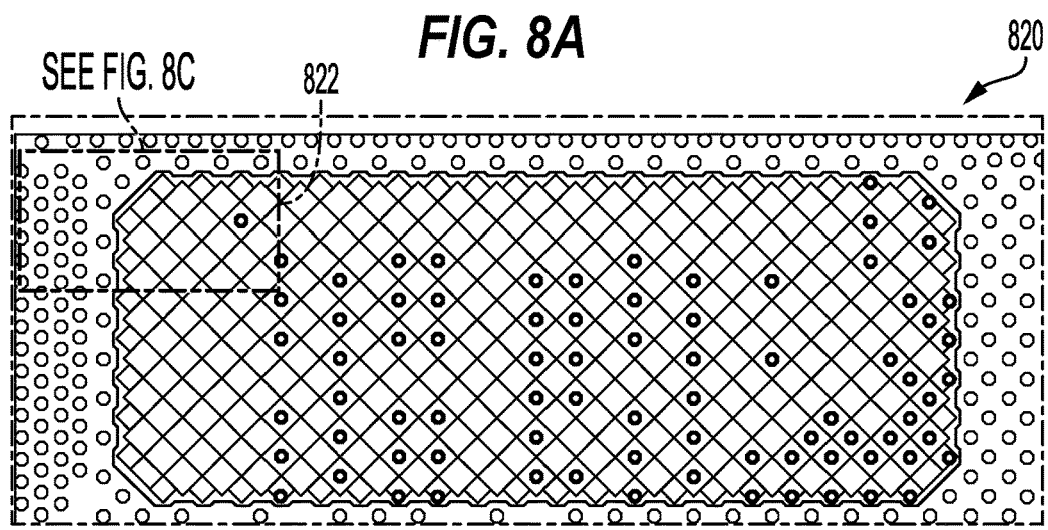
Figure 8C:
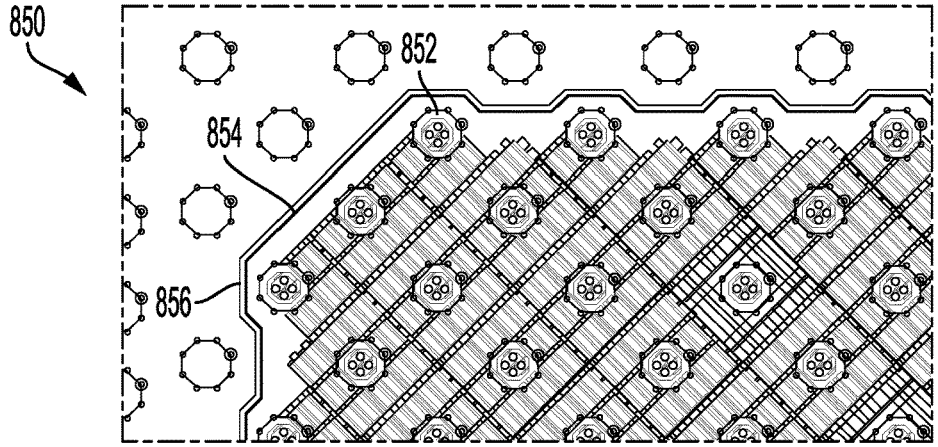

FIGS. 8A-8C are overhead views illustrating fabrication of capacitor interposer layer (CIL) chiplets using a die-to-wafer (D2W) stacking placement on an application processor (AP) chip, according to aspects of the present disclosure. FIG. 8A illustrates an overhead view of a layout 800 of the CIL chiplets 420 (420-1 . . . 420-16) of FIG. 4. In this example, the conformal edge pattern of the CIL chiplets 420 enables adjoining of the CIL chiplets 420 (420-1 . . . 420-16) to account for adjacent bumps when attached to chip bump sites, as shown FIGS. 5A-5D. This configuration illustrates D2W stacking placement of sixteen of the CIL chiplets 420 (420-1 . . . 420-16) on an AP chip, which provides improved coverage of critical bumps such as, for example, the Vdd and Vss bumps 510 of the bump sites 504, as shown in FIG. 5A. Although described regarding an AP chip, it should be recognized that aspects of the present disclosure are also applicable for fabrication of radio frequency (RF) devices using 3D integrated circuit (3DIC) devices through D2W stacking. For example, the RF devices include, but are not limited to, gallium arsenide (GaAs) devices, indium phosphide (InP) devices, gallium nitride (GaN) devices, microelectromechanical systems (MEMS) devices, acoustic resonators, and other like RF devices.

FIG. 8B illustrates an exploded view 820 of a first CIL chiplet 420-1 (shown in FIG. 8A) of the CIL chiplets 420. FIG. 8C illustrates an exploded view 850 of a highlighted area 822 (shown in FIG. 8B) of the first CIL chiplet 420-1. In this example, bumps 852 and a seal ring 854 of the first CIL chiplet 420-1 as well as a CIL chiplet boundary 856 are shown. In this configuration, the CIL chiplet boundary 856 is formed with a conformal edge pattern composed of interconnected line segments. The interconnected lines segments are formed using various angles corresponding to bumps sites proximate the conformal edge pattern. In this example, the various angles of the interconnected line segments include a zero degree (0°) angle, a forty-five degree (45°) angle, a one hundred thirty-five degree (135°) angle, and a ninety degree (90°) angle. In aspects of the present disclosure, plasma dicing, including a combination of dry etching and deep reactive-ion etching (DRIE), enables formation of the conformal edge pattern of the first CIL chiplet 420-1.

Figure 9:
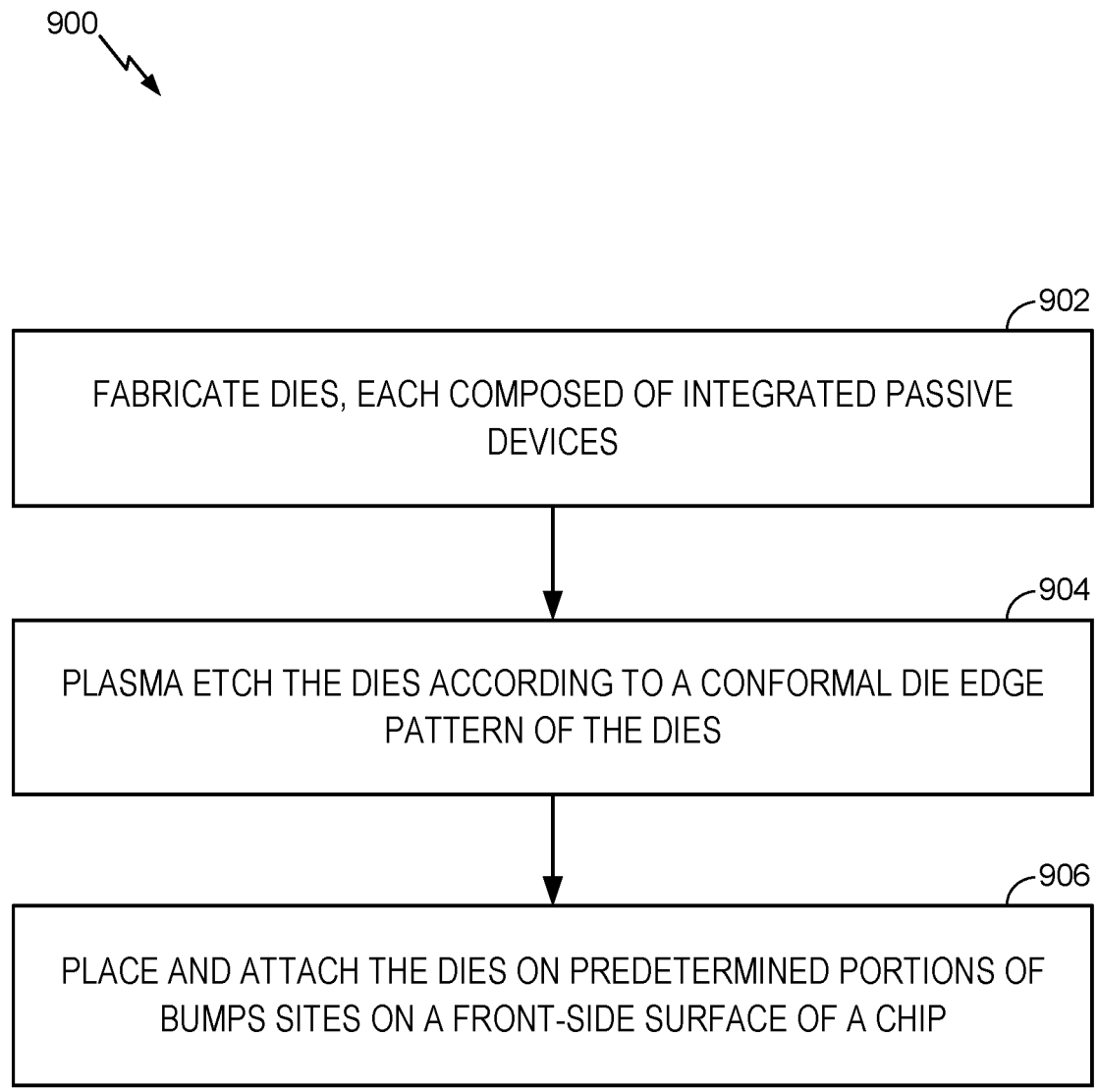
FIG. 9 is a process flow diagram illustrating a method for fabricating chiplets, according to an aspect of the present disclosure.

FIG. 9 is a process flow diagram illustrating a method of fabricating a chip, according to an aspect of the present disclosure. A method 900 begins in block 902, in which dies composed of integrated passive devices are fabricated. For example, FIG. 7A illustrates a top view of a layout 700 of the capacitor interposer layer (CIL) chiplets 420 (420-1 . . . 420-N) of FIG. 4. As shown in FIG. 4, a CIL chiplet 420 is configured with deep trench capacitors (DTCs) 430 (430-1 . . . 430-5) and through substrate vias (TSVs).

At block 904, plasma etching of the dies is performed according to a conformal chiplet edge pattern of the dies. For example, as shown in FIG. 7C, the dicing street 756 enables plasma dicing and precise singulation of the capacitor interposer layer (CIL) chiplets 420 (420-1 . . . 420-N). In this aspect of the present disclosure, plasma dicing is performed using a combination of dry etching and deep reactive-ion etching (DRIE). For dry etching, a silicon layer is removed by chemical and physical (e.g., ion bombardment) processes. In this example, reacted products are removed during a gas phase. For deep reactive-ion etching, a repeated etching process is combined with a passivation (e.g., $C_4F_8$) process to precisely singulate the CIL chiplets 420 (420-1 . . . 420-N).

At block 906, the dies are placed and attached on predetermined portions of bumps sites on a front-side surface of a chip. For example, as shown in FIG. 5B, an array of capacitor interposer layer (CIL) chiplets 420 (420-1 . . . 420-4) are placed and attached to predetermined portions of the bump sites 504. Attachment of the CIL chiplets 420 may be performed through the through substrate vias (TSVs) (e.g., the first via pair 422 and 423, the second via pair 424 and 425, and/or the third via pair 426 and 427) inside the CIL chiplets 420 (420-1 . . . 420-4). Attachment and placement of the CIL chiplets 420 (420-1 . . . 420-4) is performed while maintaining sufficient spacing from adjacent ones of the bump sites 504 to conform with the package/assembly rules. This improvement is provided by a CIL chiplet to chip die-to-wafer (D2W) placement and attachment process for three-dimensional (3D) integrated circuit (3DIC) integration of the IC package 400, as shown in FIG. 4. The method 900 further includes fabricating the dies by forming deep trench capacitors within an interposer layer of the dies. The method 900 further includes forming seal rings along the conformal die edge patterns of the dies.

According to a further aspect of the present disclosure, an integrated circuit (IC) includes an interposer layer chiplet architecture having a conformal chiplet edge pattern. In one configuration, the IC has means for storing charge. In one configuration, the charge storing means may be the deep trench capacitors 430 and/or the capacitors (e.g., 432, 434, 436, 438), as shown in FIGS. 4 and 6. In another aspect, the aforementioned means may be any structure or any material configured to perform the functions recited by the aforementioned means.

Figure 10:
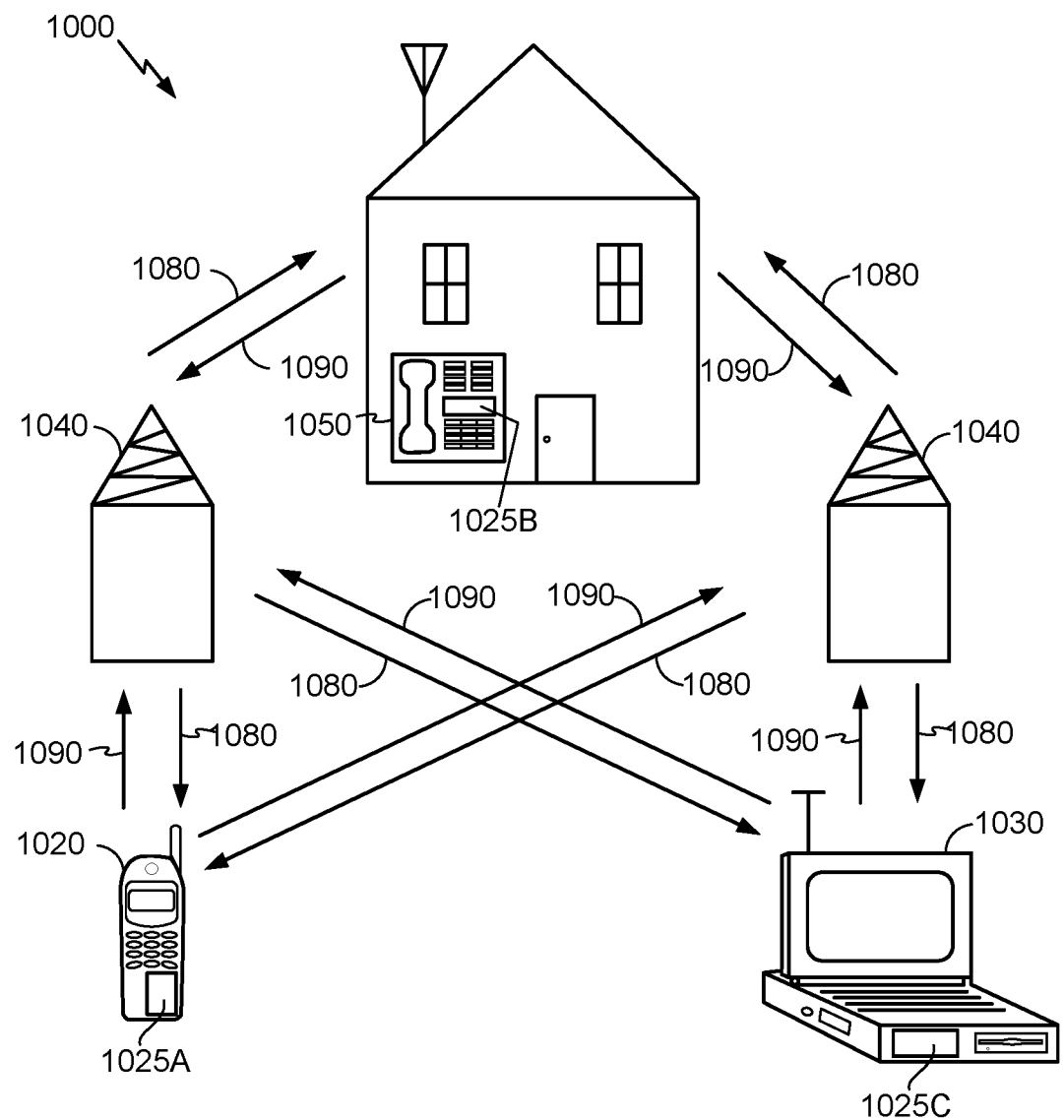
FIG. 10 is a block diagram showing an exemplary wireless communications system in which a configuration of the present disclosure may be advantageously employed.

FIG. 10 is a block diagram showing an exemplary wireless communications system 1000 in which an aspect of the present disclosure may be advantageously employed. For purposes of illustration, FIG. 10 shows three remote units 1020, 1030, and 1050, and two base stations 1040. It will be recognized that wireless communications systems may have many more remote units and base stations. Remote units 1020, 1030, and 1050 include integrated circuit (IC) devices 1025A, 1025B, and 1025C that include the disclosed capacitor interposer layer (CIL) chiplet architecture having a conformal chiplet edge pattern. It will be recognized that other devices may also include the disclosed capacitor interposer layer (CIL) chiplet architecture having a conformal chiplet edge pattern, such as the base stations, switching devices, and network equipment. FIG. 10 shows forward link signals 1080 from the base stations 1040 to the remote units 1020, 1030, and 1050, and reverse link signals 1090 from the remote units 1020, 1030, and 1050 to the base stations 1040.

In FIG. 10, remote unit 1020 is shown as a mobile telephone, remote unit 1030 is shown as a portable computer, and remote unit 1050 is shown as a fixed location remote unit in a wireless local loop system. For example, the remote units may be a mobile phone, a hand-held personal communication systems (PCS) unit, a portable data unit, such as a personal data assistant, a global positioning system (GPS) enabled device, a navigation device, a set top box, a music player, a video player, an entertainment unit, a fixed location data unit, such as meter reading equipment, or other device that stores or retrieves data or computer instructions, or combinations thereof. Although FIG. 10 illustrates remote units according to the aspects of the present disclosure, the present disclosure is not limited to these exemplary illustrated units. Aspects of the present disclosure may be suitably employed in many devices, which include the disclosed capacitor interposer layer (CIL) chiplet architecture having a conformal chiplet edge pattern.

Figure 11:
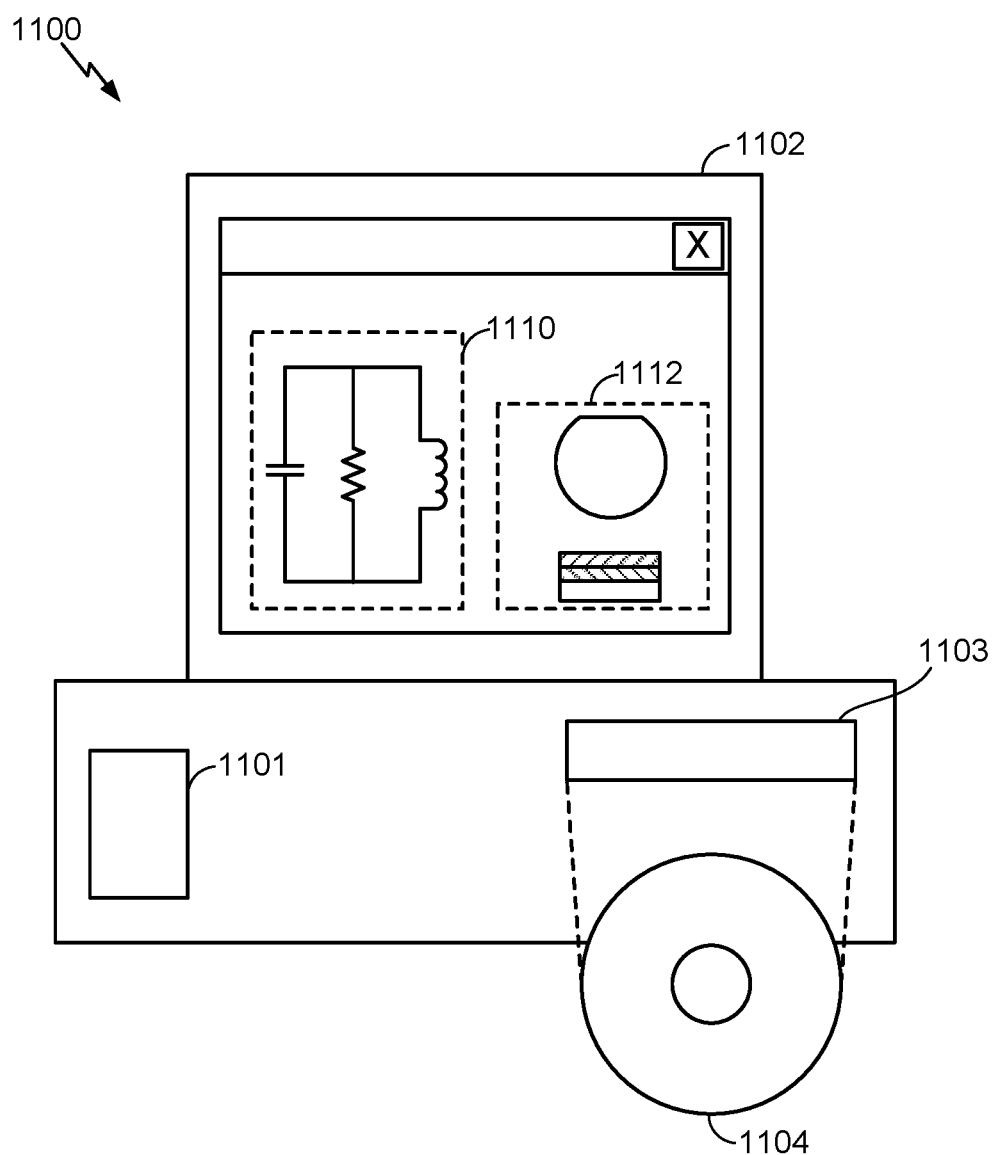
FIG. 11 is a block diagram illustrating a design workstation used for circuit, layout, and logic design of a semiconductor component according to one configuration.

FIG. 11 is a block diagram illustrating a design workstation used for circuit, layout, and logic design of a semiconductor component, such as the capacitors disclosed above. A design workstation 1100 includes a hard disk 1101 containing operating system software, support files, and design software such as Cadence or OrCAD. The design workstation 1100 also includes a display 1102 to facilitate design of a circuit 1110 or an RF component 1112, such as a capacitor interposer layer (CIL) chiplet architecture having a conformal chiplet edge pattern. A storage medium 1104 is provided for tangibly storing the design of the circuit 1110 or the RF component 1112 (e.g., the CIL chiplet architecture having a conformal chiplet edge pattern). The design of the circuit 1110 or the RF component 1112 may be stored on the storage medium 1104 in a file format such as GDSII or GERBER. The storage medium 1104 may be a compact disc read-only memory (CD-ROM), digital versatile disc (DVD), hard disk, flash memory, or other appropriate device. Furthermore, the design workstation 1100 includes a drive apparatus 1103 for accepting input from or writing output to the storage medium 1104.

Implementation examples are described in the following numbered clauses:
1. An integrated circuit (IC) package, comprising:
   a chip having a front-side surface and a backside surface, opposite the front-side surface, the front-side surface having a plurality of bump sites; and
   a plurality of dies, each of the plurality of dies comprising integrated passive devices, the plurality of dies having conformal die edge patterns to enable placement of a front-side surface of each of the plurality of dies on predetermined portions of the plurality of bumps sites on the front-side surface of the chip.
2. The integrated circuit (IC) package of clause 1, in which the plurality of dies comprises an interposer chiplet.
3. The integrated circuit (IC) package of clause 2, in which the interposer chiplet comprises deep trench capacitors (DTC).

4. The integrated circuit (IC) package of any of clauses 1-3, in which the plurality of dies comprises a capacitor interposer layer (CIL) chiplet.
5. The integrated circuit (IC) package of any of clauses 1-4, in which the plurality of dies comprises seal rings along the conformal die edge patterns.
6. The integrated circuit (IC) package of any of clauses 1-5, in which the plurality of dies comprises:
a die substrate;
a capacitor interposer layer within the die substrate;
a redistribution layer on the capacitor interposer layer and the die substrate;
and an under bump metallization layer on the redistribution layer.
7. The integrated circuit (IC) package of clause 6, further comprising:
a mold compound on a surface of the redistribution layer and sidewalls of the die substrate.
8. The integrated circuit (IC) package of clause 6 or clause 7, in which the die substrate comprises a plurality of through substrate vias.
9. The integrated circuit (IC) package of any of clauses 1-8, in which the chip comprises an application processor (AP) chip or a system on chip (SOC).
10. The integrated circuit (IC) package of any of clauses 1-8, in which the chip comprises a radio frequency integrated circuit (RFIC) chip.
11. The integrated circuit (IC) package of any of clauses 1-10, in which the conformal die edge patterns of the plurality of dies comprise rounded die edges.
12. The integrated circuit (IC) package of any of clauses 1-10, in which the conformal die edge patterns of the plurality of dies comprise curved die edges.
13. The integrated circuit (IC) package of any of clauses 1-10, in which the conformal die edge patterns of the plurality of dies comprise curved die edges corresponding to bumps sites proximate the curved die edges.
14. The integrated circuit (IC) package of any of clauses 1-10, in which the conformal die edge patterns of the plurality of dies comprise interconnected line segments having a zero degree (0°) angle, a forty-five degree (45°) angle, a one hundred thirty-five degree (135°) angle, and a ninety degree (90°) angle.
15. A method for fabricating a chip, comprising:
fabricating a plurality of dies, each of the plurality of dies comprising integrated passive devices;
plasma etching the plurality of dies according to conformal die edge patterns of the plurality of dies; and
placing and attaching the plurality of dies on predetermined portions of a plurality of bump sites on a front-side surface of the chip.
16. The method of clause 15, in which fabricating the plurality of dies comprises forming deep trench capacitors within an interposer layer of the plurality of dies.
17. The method of clause 15 or clause 16, in which fabricating the plurality of dies comprises:
forming a capacitor interposer layer within a die substrate;
forming a redistribution layer on the capacitor interposer layer and the die substrate; and
forming an under bump metallization layer on the redistribution layer.
18. The method of clause 17, further comprising depositing a mold compound on a surface of the redistribution layer and sidewalls of the die substrate.
19. The method of clause 17 or clause 18, further comprising forming a plurality of through substrate vias within the die substrate.
20. The method of any of clauses 15-19, further comprising forming seal rings along the conformal die edge patterns of the plurality of dies.

Data recorded on the storage medium 1104 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1104 facilitates the design of the circuit 1110 or the RF component 1112 by decreasing the number of processes for designing semiconductor wafers.

For a firmware and/or software implementation, the methodologies may be implemented with modules (e.g., procedures, functions, and so on) that perform the functions described. A machine-readable medium tangibly embodying instructions may be used in implementing the methodologies described. For example, software codes may be stored in a memory and executed by a processor unit. Memory may be implemented within the processor unit or external to the processor unit. As used herein, the term "memory" refers to types of long term, short term, volatile, nonvolatile, or other memory and is not limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include random access memory (RAM), read-only memory (ROM), electrically erasable programmable read-only memory (EEPROM), compact disc read-only memory (CD-ROM) or other optical disk storage, magnetic disk storage or other magnetic storage devices, or other medium that can be used to store desired program code in the form of instructions or data structures and that can be accessed by a computer. Disk and disc, as used herein, include compact disc (CD), laser disc, optical disc, digital versatile disc (DVD), floppy disk, and Blu-ray® disc, where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communications apparatus. For example, a communications apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the present disclosure may be embodied directly in hardware, in a software module executed by a processor, or in a combination of the two. A software module may reside in random access memory (RAM), flash memory, read-only memory (ROM), erasable programmable read-only memory (EPROM), electrically erasable programmable read-only memory (EEPROM), registers, hard disk, a removable disk, a compact disc read-only memory (CD-ROM), or any other form of storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a user terminal. In the alternative, the processor and the storage medium may reside as discrete components in a user terminal.

The previous description of the disclosure is provided to enable any person skilled in the art to make or use the disclosure. Various modifications to the disclosure will be readily apparent to those skilled in the art, and the generic principles defined may be applied to other variations without departing from the spirit or scope of the disclosure. Thus, the disclosure is not intended to be limited to the examples and designs described but is to be accorded the widest scope consistent with the principles and novel features disclosed.

What is claimed is:

1. An integrated circuit (IC) package, comprising:
   a chip having a front-side surface and a backside surface, opposite the front-side surface, the front-side surface having a plurality of bump sites; and
   a plurality of dies, each of the plurality of dies comprising integrated passive devices, the plurality of dies having conformal non-rectangular die edge patterns to enable placement of a front-side surface of each of the plurality of dies on predetermined portions of the plurality of bumps sites on the front-side surface of the chip.

2. The integrated circuit (IC) package of claim 1, in which the plurality of dies comprises an interposer chiplet.

3. The integrated circuit (IC) package of claim 2, in which the interposer chiplet comprises deep trench capacitors (DTC).

4. The integrated circuit (IC) package of claim 1, in which the plurality of dies comprises a capacitor interposer layer (CIL) chiplet.

5. The integrated circuit (IC) package of claim 1, in which the plurality of dies comprises seal rings along the conformal non-rectangular die edge patterns.

6. The integrated circuit (IC) package of claim 1, in which the plurality of dies comprises:
   a die substrate;
   a capacitor interposer layer within the die substrate;
   a redistribution layer on the capacitor interposer layer and the die substrate; and
   an under bump metallization layer on the redistribution layer.

7. The integrated circuit (IC) package of claim 6, further comprising a mold compound on a surface of the redistribution layer and sidewalls of the die substrate.

8. The integrated circuit (IC) package of claim 6, in which the die substrate comprises a plurality of through substrate vias.

9. The integrated circuit (IC) package of claim 1, in which the chip comprises an application processor (AP) chip or a system on chip (SOC).

10. The integrated circuit (IC) package of claim 1, in which the chip comprises a radio frequency integrated circuit (RFIC) chip.

11. The integrated circuit (IC) package of claim 1, in which the conformal non-rectangular die edge patterns of the plurality of dies comprise rounded die edges.

12. The integrated circuit (IC) package of claim 1, in which the conformal non-rectangular die edge patterns of the plurality of dies comprise curved die edges.

13. The integrated circuit (IC) package of claim 1, in which the conformal non-rectangular die edge patterns of the plurality of dies comprise curved die edges corresponding to bumps sites proximate the curved die edges.

14. The integrated circuit (IC) package of claim 1, in which the conformal non-rectangular die edge patterns of the plurality of dies comprise interconnected line segments having a zero degree (0°) angle, a forty-five degree (45°) angle, a one hundred thirty-five degree (135°) angle, and a ninety degree (90°) angle.

15. A method for fabricating a chip, comprising:
   fabricating a plurality of dies, each of the plurality of dies comprising integrated passive devices;

plasma etching the plurality of dies according to conformal non-rectangular die edge patterns of the plurality of dies; and placing and attaching the plurality of dies on predetermined portions of a plurality of bump sites on a front-side surface of the chip.

16. The method of claim 15, in which fabricating the plurality of dies comprises forming deep trench capacitors within an interposer layer of the plurality of dies.

17. The method of claim 15, in which fabricating the plurality of dies comprises:

forming a capacitor interposer layer within a die substrate;

forming a redistribution layer on the capacitor interposer layer and the die substrate; and forming an under bump metallization layer on the redistribution layer.

18. The method of claim 17, further comprising depositing a mold compound on a surface of the redistribution layer and sidewalls of the die substrate.

19. The method of claim 17, further comprising forming a plurality of through substrate vias within the die substrate.

20. The method of claim 15, further comprising forming seal rings along the conformal non-rectangular die edge patterns of the plurality of dies.

* * * * *